United States Patent [19]

Gaglani

[11] Patent Number: 5,175,753
[45] Date of Patent: Dec. 29, 1992

[54] COUNTER CELL INCLUDING A LATCH CIRCUIT, CONTROL CIRCUIT AND A PULL-UP CIRCUIT

[75] Inventor: Pranay Gaglani, Austin, Tex.

[73] Assignee: Advanced Micro Devices, Inc., Sunnyvale, Calif.

[21] Appl. No.: 678,510

[22] Filed: Apr. 1, 1991

[51] Int. Cl.[5] .............................. H03K 23/8
[52] U.S. Cl. ........................ 377/105; 377/104; 377/111; 377/114; 377/117; 377/121
[58] Field of Search ............... 377/104, 105, 111, 114, 377/117, 121

[56] References Cited

U.S. PATENT DOCUMENTS

| | | | |
|---|---|---|---|
| 3,657,557 | 4/1972 | Smith et al. | 377/105 |
| 4,025,800 | 5/1977 | Wanlass | 377/117 |
| 4,114,052 | 9/1978 | Manabe et al. | 377/121 |
| 4,512,030 | 4/1985 | Fukuta | 377/105 |
| 4,882,505 | 11/1989 | Furman | 377/111 |

Primary Examiner—Stanley D. Miller
Assistant Examiner—Scott A. Ouellette
Attorney, Agent, or Firm—Davis Chin

[57] ABSTRACT

A counter cell includes a latch circuit, control circuit, and a pull-up circuit. The laatch circuit is formed of a first clocked half-latch (32), a second clocked half-latch (34) and an inverter (INV1) for storing a binary output signal. The first clocked half-latch (32) is responsive to a first clockk phase signal for transferring the binary output signal from its input to its output. The second clocked half-latch (34) is responsive to a second clock phase signal for transferring binary output signal from its input to its output. The control circuit is responsive to an input complement signal for selectively passing the first clock phase signal to the first clocked half-latch so as to permit toggling the state of the binary output signal. The pull-up circuit is responsive to the binary output signal and the input complement signal for generating an output complement signal. The logic value of the output complement signal is equal to the logic value of the input complement signal only when a binary output signal is at a high logic level. The logic value of the output complement signal is maintained at a high logic level when the binary output signal is at a low logic level. Any number of these counter cells can be arranged to form an N-bit counter circuit.

20 Claims, 3 Drawing Sheets

COUNTER CELL INCLUDING A LATCH CIRCUIT, CONTROL CIRCUIT AND A PULL-UP CIRCUIT

BACKGROUND OF THE INVENTION

This invention relates generally to semiconductor integrated circuit devices and more particularly, it relates to an improved counter circuit formed of a plurality of substantially identical bit cells in which each bit cell is fabricated with a smaller number of components than has been traditionally available.

As is generally well known in the art, one of the most common ways to synchronize events occurring in digital logic circuitry is achieved by utilizing conventional counter circuits. These counter circuits are typically adapted to count up to a certain number of clock pulses. Further, such counter circuits may be operated on straight binary counting codes, Gray codes, or any other suitable code arrangement. Dependent upon the range of the counter circuit desired, there is determined the number of counter cells or stages to be required. Each of the counter cells corresponds to one bit of the counter circuit.

In the normal binary counting operation of an up-counter, prior to starting of the counting circuit a reset signal is supplied to each of the counter cells so that each bit will be initially set to "zero." Thereafter, at each cycle of the clock pulses the counter circuit will count up by one. For example, in the case of a 4-bit counter circuit, when the reset signal is applied the values of the four bits will be set to $\emptyset\emptyset\emptyset\emptyset$. Then, after each cycle of the clock pulses following the reset signal, the values of the four bits will be changed to: $\emptyset\emptyset\emptyset$, $\emptyset\emptyset 1\emptyset$, $\emptyset\emptyset 11$, and so on.

Figure 1:
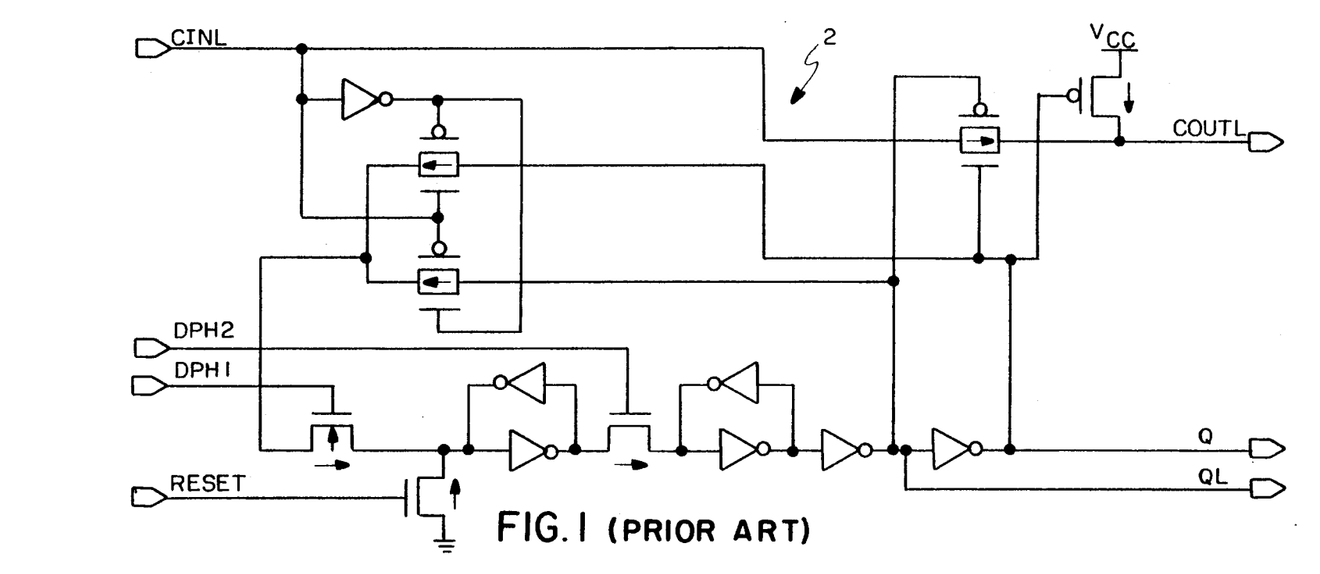
FIG. 1 is a schematic circuit diagram of a prior art counter cell.

At the present time, most of the prior art counter circuits employ two-phase clocking signals or pulses, with a carry chain. At each cycle of the clock pulses, the values of the carry-in signal and the current state of a particular bit are used to determine the next output state of the particular bit and to generate a carry-out signal. Generally, a logic "AND" function is used to generate the carry-out signal, and a logic "EXCLUSIVE OR" function is performed on the carry-in signal and the current state of the particular bit so as to output the new or next state of the particular bit. A prior art counter cell 2 utilizing this technique is shown in FIG. 1. As can be seen, this approach requires the use of twenty-four (24) MOS transistors. Since a relatively large number of components is used in this implementation of each counter cell, there is required the need of increased amounts of chip area, which not only increases manufacturing costs but also adds to the amount of power dissipation.

It would therefore be desirable to provide an improved counter circuit which contains a plurality of substantially identical bit cells, each cell being formed with a smaller number of components than has been traditionally required. Further, it also would be expedient to construct each bit cell to be of a regular configuration or structure so as to conform to a repeatable pattern suitable for very large scale integration (VLSI) with high packing density.

SUMMARY OF THE INVENTION

Accordingly, it is a general object of the present invention to provide an improved counter circuit which is relatively simple and economical to manufacture and assemble.

It is an object of the present invention to provide an improved counter cell which is formed of a relatively small number of components, thereby reducing IC chip size and power dissipation.

It is another object of the present invention to provide an improved counter circuit formed of a plurality of substantially identical bit cells or stages in which each bit cell thereof has a regular structure suitable for very large scale integration.

In accordance with these aims and objectives, the present invention is concerned with the provision of a counter cell which includes a latch circuit, a control circuit, and a pull-up circuit. The latch circuit stores a binary output signal. The latch circuit is formed of a first clocked half-latch having an input and an output, a second clocked half-latch having its input connected to the output of the first clocked half-latch and an output, and an inverter having its input connected to the output of the second clocked half-latch and its output connected to the input of the first clocked half-latch. The first clocked half-latch is responsive to a first clock phase signal for transferring the binary output signal from its input to its output. The second clocked half-latch is responsive to a second clock phase signal for transferring the binary output signal from its input to its output.

The control circuit is responsive to an input complement signal for selectively passing the first clock phase signal to the first clocked half-latch so as to permit toggling the state of the binary output signal. The pull-up circuit is responsive to the binary output signal and the input complement signal for generating an output complement signal. The logic value of the output complement signal is equal to the logic value of the input complement signal only when the binary output signal is at a high logic level. The logic value of the output complement signal is maintained at a high logic level when the binary output signal is at a low logic level.

In another aspect of the invention, a plurality of the counter cells are arranged to form an N-bit up-counter. In still another aspect of the present invention, the counter cells are arranged to form a 4-bit up-counter.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
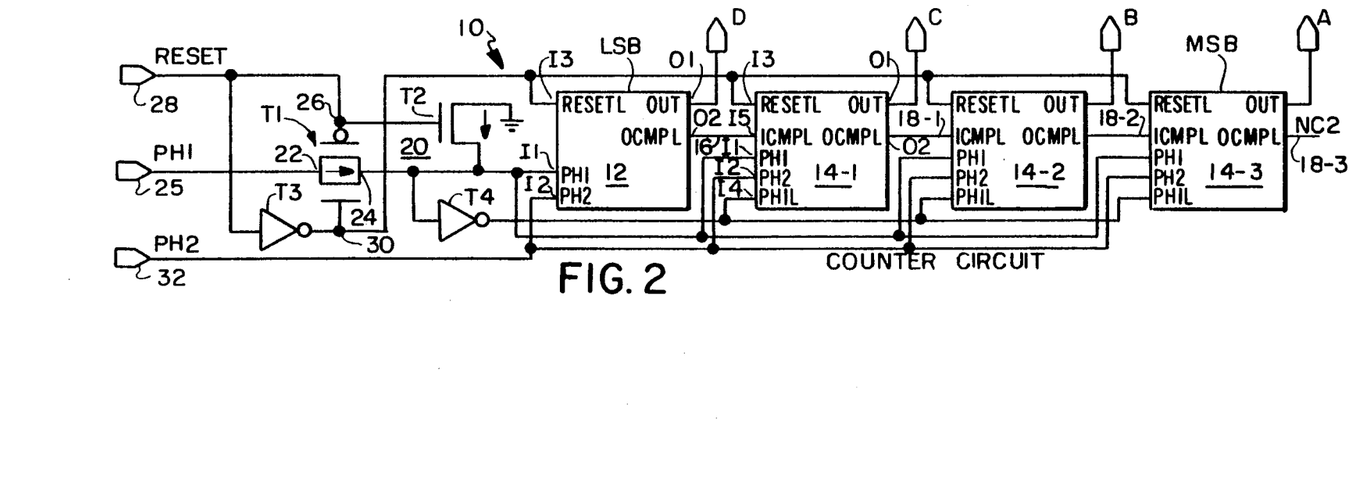
FIG. 2 is a block diagram of a 4-bit counter circuit, constructed in accordance with the principles of the present invention.

Referring now in detail to the drawings, there is shown in FIG. 2 a block diagram of a counter circuit 10 constructed in accordance with a preferred embodiment of the present invention. The counter circuit 10 includes a first counter cell or stage 12 for the least significant bit (LSB) and a plurality of identical second counter cells or stages 14-1, 14-2 and 14-3 for the remaining bits. Dependent on the desired range of the counter circuit, it should be understood to those skilled in the art that this determines the number of identical second counter stages 14 required. The counter circuit 10 of FIG. 2 comprises a 4-b-it up-counter which is exemplary of the present invention. Thus, the counter circuit 10 includes one first counter stage 12 and three identical second counter stages 14 designated as 14-1, 14-2 and 14-3.

Each of the counter stages 12 and 14 is constructed with a relatively small number of circuit components so as to use a reduced amount of semiconductor chip area, thereby reducing manufacturing costs and power dissipation. Further, the counter stages 12 and 14 are constructed of a regular configuration suitable for use in large scale integrated circuit arrays which may be mass produced and may also be formed as a part of a monolithic semiconductor integrated circuit.

The first counter stage 12 includes three input signals consisting of a first input clock phase signal PH1 on input terminal I1, a second input clock phase signal PH2 on input terminal I2, and the complement RESETL of a reset signal RESET on input terminal I3. The counter stage 12 provides two output signals consisting of an output bit signal OUT on a first output terminal 01, which represents the least significant bit D, and an output complement signal OCMPL on a second output terminal 02 connected to line 16.

Each of the three second counter stages 14-1, 14-2 and 14-3 receives not only the same three input signals PH1, PH2 and RESETL, but it also receives the complement of PH1, PH1L, on input terminal 14 and an input complement signal ICMPL on input terminal 15. The counter stages 14-1, 14-2 and 14-3 also provides corresponding output complement signals OCMPL on the second output terminals 02 connected to lines 18-1, 18-2 and 18-3, respectively. It will be noted that the input terminal I5 of each counter stage 14-1, 14-2 and 14-3 is connected to receive the corresponding output complement signal OCMPL via the lines 16, 18-1 and 18-2 of the preceding counter stage. The output complement signal OCMPL on line 18-3 of the last counter stage 14-3 is left unconnected. The counter stages 14-1, 14-2 and 14-3 also generate output bit signals OUT on their output terminal 01 for the bits C, B and A, wherein the output terminal 01 for the bit A represents the most significant bit (MSB).

The counter stage 10 further includes a control section 20 formed of a transmission gate T1, an N-channel MOS transistor T2, and a pair of inverters T3, T4. The transmission gate T1 is formed of a P-channel MOS transistor and an N-channel MOS transistor. The sources of the P-channel and N-channel transistors are connected to its input node 22, and the drains thereof are connected to its output node 24. The input node 22 is tied to an input terminal 25 for receiving the first clock phase signal PH1. The gate electrode of the P-channel transistor is joined to a control node 26 which is connected to an input terminal 28 for receiving the reset signal RESET. The gate electrode of the N-channel transistor is joined to a control node 30 and to the output of the inverter T3. The input of the inverter T3 is also connected to the input terminal 28 for receiving the reset signal RESET. The output of the inverter T3 defining the complement RESETL of the reset signal is also fed to the input terminals I3 of the respective counter stages 12 and 14.

The control node 26 is also connected to the gate electrode of the transistor T2. The transistor T2 has its drain electrode connected to the output node 24 of the transmission gate T1 and has its source electrode connected to a ground potential. The output node 24 of the transmission gate T1 is also fed to the input terminals I1 of the counter stages 12 and 14 and to the input of the inverter T4. The output of the inverter T4 provides the complement PH1L of the first clock phase signal PH1 and is delivered to the input terminals I4 of the counter stages 14-1, 14-2 and 14-3. The second clock phase signal PH2 received on the input terminal 32 is applied to the input terminals I2 of the counter stages 12 and 14.

The operation of counter circuits is well known in the art. While various types of code arrangements may be used, the typically binary code pattern is illustrated in the Table listed below. The code pattern in the Table is directed to a 4-bit, up-counter operation which provides sixteen counts (∅-15).

TABLE

| | Counting Sequence of Operation | | | |
| --- | --- | --- | --- | --- |
| | | Column Bit | | |
| COUNT | A | B | C | D |
| ∅ | ∅ | ∅ | ∅ | ∅ |
| 1 | ∅ | ∅ | ∅ | 1 |
| 2 | ∅ | ∅ | 1 | ∅ |
| 3 | ∅ | ∅ | 1 | 1 |
| 4 | ∅ | 1 | ∅ | ∅ |
| 5 | ∅ | 1 | ∅ | 1 |
| 6 | ∅ | 1 | 1 | ∅ |
| 7 | ∅ | 1 | 1 | 1 |
| 8 | 1 | ∅ | ∅ | ∅ |
| 9 | 1 | ∅ | ∅ | 1 |
| 10 | 1 | ∅ | 1 | ∅ |
| 11 | 1 | ∅ | 1 | 1 |
| 12 | 1 | 1 | ∅ | ∅ |
| 13 | 1 | 1 | ∅ | 1 |
| 14 | 1 | 1 | 1 | ∅ |
| 15 | 1 | 1 | 1 | 1 |

In order to achieve the same functionality of the counter cell 2 of FIG. 1 with the use of a smaller number of circuit components, the updating or toggling of the current value of a particular counter cell or bit is permitted selectively to occur only when it is needed. In other words, it can be observed from the Table above that the least significant bit (LSB) in Column D toggles or changes on each count operation. That is, the column bit D is alternately ∅, 1, ∅, 1 and so on. It is also noted that for any count which includes all binary 1's in consecutive bit positions beginning from the least significant bit position the next higher bit position will toggle on the next count operation. For example, at count 3 (∅∅11) the least significant bit in column bit D and the next least significant bit in column bit C are both "1's." As a result, on the next count operation (count 4), the bits in both columns D and C toggle and the next higher bit position in column B will also toggle (from ∅ to 1). A similar situation occurs at count 7 (∅111) and at count 15 (1111). Therefore, it can be seen that the most significant bit in column bit A will change its state only once during the entire range of counts (∅-15).

Figure 4:
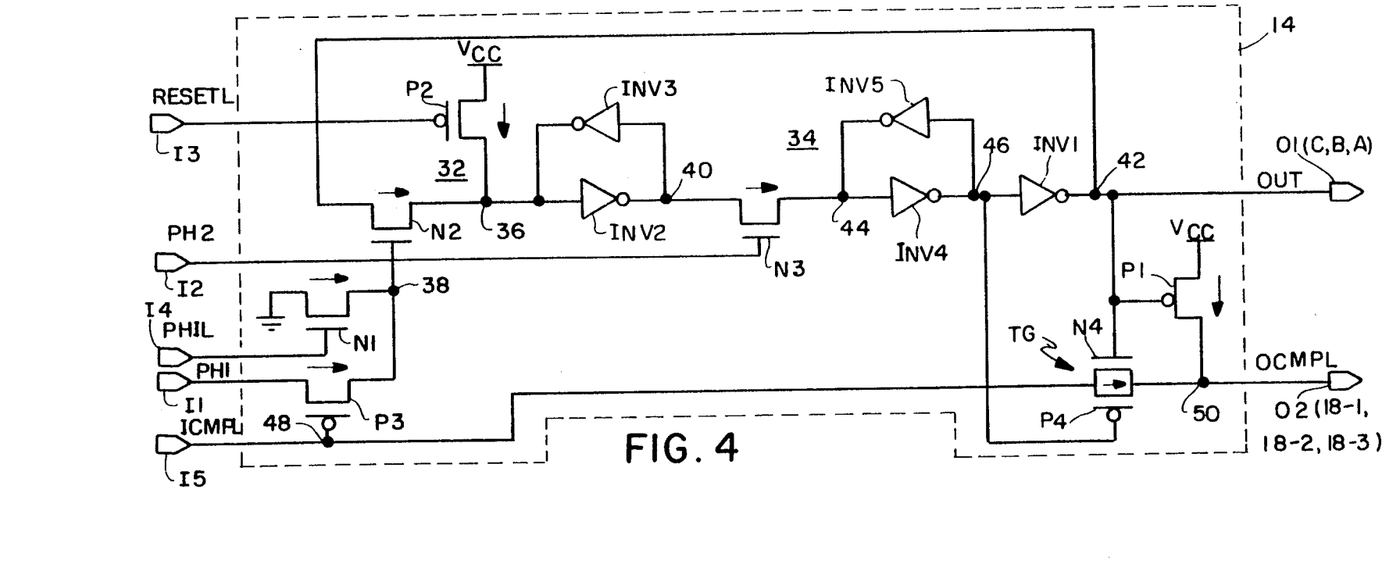
FIG. 4 is a schematic circuit diagram of a counter cell of the present invention for use in the counter cells 14 of FIG. 2.

In FIG. 4, there is shown a schematic circuit diagram of one of the second counter cell or stages 14 for use in each of the blocks 14-1, 14-2 and 14-3 of the counter circuit 10 in FIG. 2 of the present invention. In this schematic circuit diagram, the input and output terminals which are similar to those shown in FIG. 2 are similarly numbered or labeled. The counter stage 14 includes a first clocked half-latch 32, a second clocked half-latch 34, and an inverter INVI, a transmission gate TG, a pull-up P-channel MOS transistor P1, a reset P-channel MOS transistor P2, an inhibit P-channel MOS transistor P3 and a discharge N-channel MOS transistor N1.

The first clocked half-latch 32 consists of a first N-channel pass transistor N2 and inverters INV2, INV3. The transistor N2 has its drain connected to a node 36 and to the input of the inverter INV2. The gate of the transistor N2 is connected to a charge/discharge node 38. The output of the inverter INV2 is connected to a node 40 and to the input of the inverter INV3. The output of the inverter INV3 is connected to the input of the inverter INV2. The source of the transistor N2 is connected to the output of the inverter INVI at output node 42. The second clocked half-latch 34 consists of a second N-channel pass transistor N3, and inverters INV4, INV5. The transistor N3 has its drain connected to a node 44 and to the input of the inverter INV4. The gate of the transistor N3 is connected to the input terminal I2 for receiving the second clock phase signal PH2. The output of the inverter INV4 is connected to a node 46 and to the input of the inverter INV5. The output of the inverter INV5 is connected to the input of the inverter INV4. The source of the transistor N3 is connected to the output of the inverter INV2 at the node 40. Each of the inverters INVI through INV5 is a conventional CMOS inverter comprised of a P-channel MOS transistor and an N-channel MOS transistor whose gate electrodes are connected together to define its input and whose drains are connected together to form its output.

The transmission gate TG is formed of a P-channel MOS transistor P4 and an N-channel MOS transistor N4. The sources of the transistors P4 and N4 are connected to its input node 48, and the drains thereof are connected to its output node 50. The input node 48 is tied to the input terminal I5 for receiving the input complement signal ICMPL. The output node 50 is joined to the output terminal O2 (line 18) for providing the output complement signal OCMPL to the next stage. The gate electrode of the transistor P4 is connected to the output of the inverter INV4 at the node 46, and the gate electrode of the transistor N4 is connected to the output of the inverter INV1 at the output node 42. The pull-up transistor P1 has its source connected to a supply potential VCC, which is typically at +5.0 volts, and its drain connected to the output terminal O2 (line 18) at the node 50. The gate of the transistor P1 is also connected to the output node 42.

The reset transistor P2 has its source connected to the supply potential VCC and its drain connected to the node 36. The gate of the transistor P2 is connected to the input terminal I3 for receiving the complement RESETL of the reset signal. The inhibit transistor P3 has its drain connected to the charge/discharge node 38 and its source connected to the input terminal I1 for receiving the first clock phase signal PH1. The gate of the transistor P3 is connected to the input terminal I5 via the node 48 for receiving the input complement signal ICMPL. The discharge transistor N1 has its drain connected to the charge/discharge node 38 and its source connected to a ground potential. The gate of the transistor N1 is connected to the input of terminal I4 for receiving the complement PH1L of the first clock phase signal.

Figure 3:
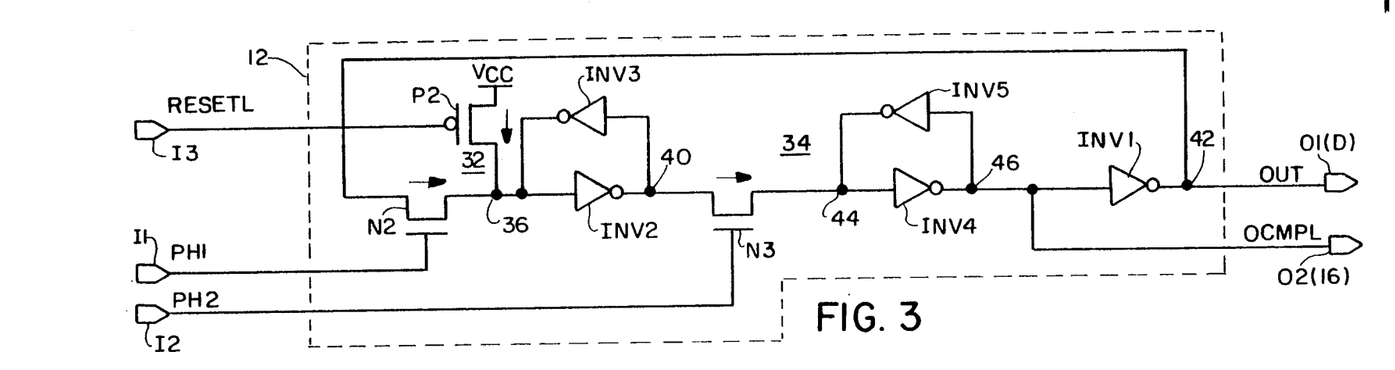
FIG. 3 is a schematic circuit diagram of a counter cell of the present invention for use in the least significant bit counter stage 12 of FIG. 2.

In FIG. 3 of the drawings, there is illustrated a schematic circuit diagram of the first counter stage 12 of the counter circuit 10 of FIG. 2 of the present invention. It will be noted that the first counter stage 12 of FIG. 3 is quite similar to the second counter stage 14 of FIG. 4, with like parts being designated by the same reference numerals. As can be seen, the discharge transistor N1 and the inhibit transistor P4 in FIG. 4 have been omitted since the counter stage 12 being the least significant bit is always toggled for each cycle of the clock phase signal PH1, as was previously pointed out. Thus, the gate of the pass transistor N2 is connected directly to the input terminal I1 so as to receive the first clock phase signal PH1. Further, it can be seen that the pull-up transistor P1 and the transmission gate TG in FIG. 4 have also been eliminated since the least significant bit does not receive an input complement signal ICMPL and the output of the inverter I4 at the node 46 provides the output complement signal OCMPL on the output line 16 for the counter stage 12.

FIGS. 5(a) through 5(g) are timing diagrams which are useful in understanding the operation of the 4-bit up-counter circuit 10 of FIG. 2. In describing the counting sequence of the counter circuit of FIG. 2, reference will also be made simultaneously to FIGS. 3 and 4. As can be seen from FIG. 5(g), the reset signal RESET applied to the input terminal 28 is at a logic "1" level prior to time t∅. Thus, the transmission gate T1 is open so that the first clock phase signal PH1 is prevented from being applied to the input terminals I1 of the counter stages 12 and 14. This reset signal RESET is also inverted by the inverter T3 so as to apply a low or "∅" logic level to the gates of the reset transistors P2 in the counter stages 12 (FIG. 3) and 14 (FIG. 4). This ensures that the output bits ABCD will be reset to store all zeroes (∅∅∅∅) before the counting operation is permitted to begin. Accordingly, the input complement signal on the output line 16 to the second stage 14-1 will be at a high logic level. Further, the input complement signal on the respective lines 18-1 and 18-2 from the second counter stages 14-1 and 14-2 will also be at the high logic level since all the pull-up transistors P1 will be rendered conductive.

Figure 5:
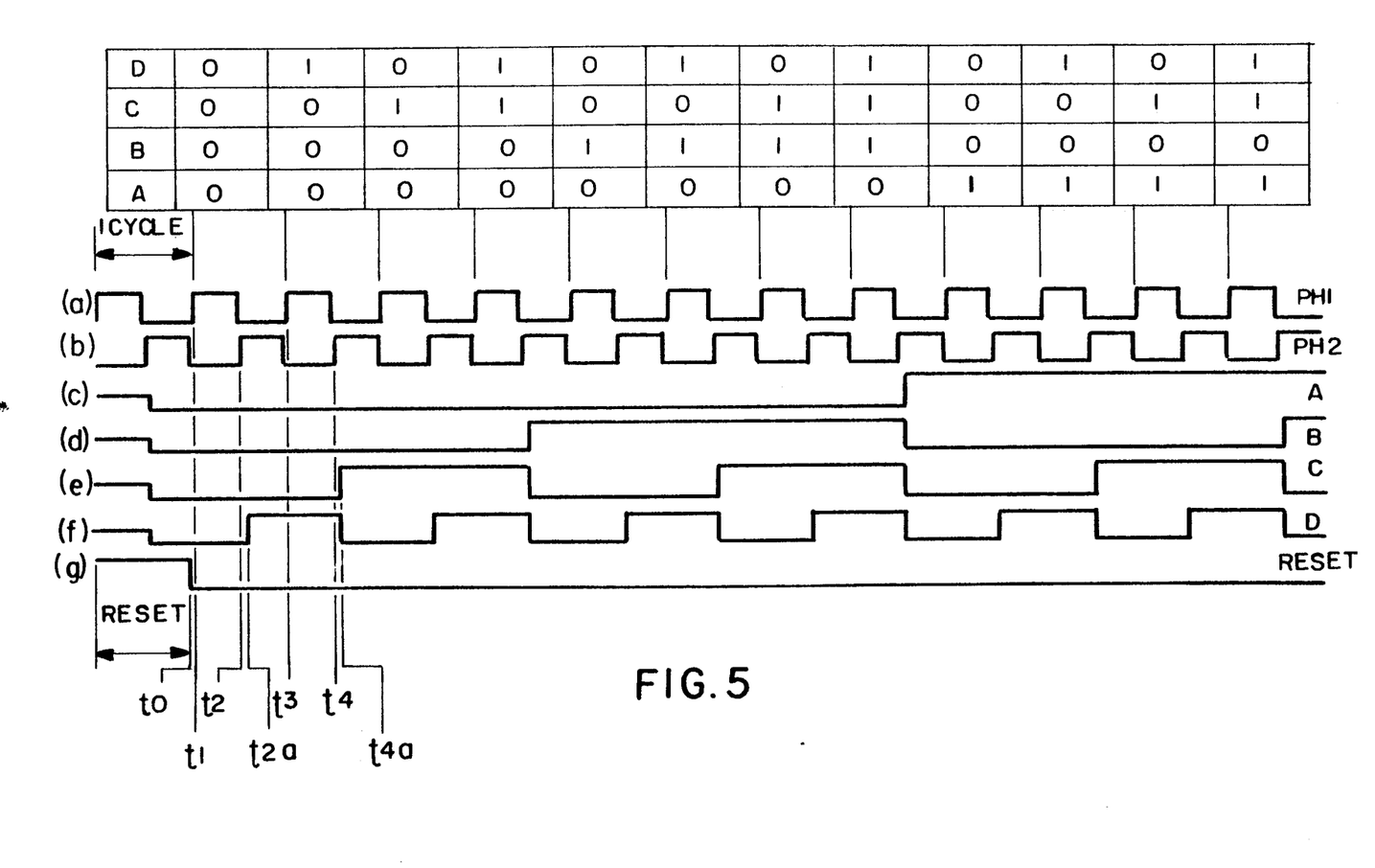
FIGS. 5(a)–5(g) are timing diagrams useful in understanding the operation of the counter circuit of FIG. 2.

At time t∅, the reset signal RESET makes a high-to-low transition which closes the transmission gate T1 in order to initialize the counting. When the first clock phase signal PH1 goes high at time t1, as illustrated in FIG. 5(a), the half-latch 32 (FIG. 3) will be transparent so as to permit the low logic level at the output of the inverter INV1 (bit D=∅), which is passed through the pass transistor N2, to reach the output of the inverter INV2 at the node 40. Due to the inverter INV2, the node 40 will be at a high or "1" logic level. It should be noted that this high level of the first clock phase signal PH1 at the time t1 does not reach the gates of the corresponding pass transistors N2 (FIG. 4) in the counter stages 14-1 through 14-3 since the input complement signal ICMPL on the respective input terminals I5 will be at the high level, thereby rendering the inhibit transistor P3 to be nonconductive. Consequently, the output bits B, C and D will remain unchanged.

Referring back to FIG. 3 again, when the second clock phase signal PH2 goes high at time t2, as depicted in FIG. 5(b), the half-latch 34 will be transparent so as to allow the high logic level at the node 40, which is passed through the pass transistor N3, to reach the output of the inverter INV4. Due to the inverter INV4, the node 46 will be at a low logic level. Further, this low logic level will be inverted again by the inverter INV1 so as to toggle the output bit D at time t2a, as shown in FIG. 5(f). As a result, the output state of the counter stage 12 will be D=1 and the output complement signal OCMPL on the line 16 will be at a low logic level, which is the input complement signal ICMPL for the counter stage 14-1. Therefore, the output bits ABCD will be ØØØ1 at the time t2a, which are illustrated in respective FIG. 5(c) through 5(f).

At time t3 when the next first clock phase signal PH1 goes high, the output bit D being high will again be passed to the node 40 (FIG. 3). At time t4 when the next second clock phase signal PH2 goes high, the output bit D will be toggled to a low logic level at time t4a (FIG. 5(f)). Simultaneously, at the time t3 the high level of the first clock phase signal PH1 will also be transferred to the gate of the pass transistors N2 (node 38) in the counter stage 14-1 (FIG. 4) since its input complement signal will be at a low logic level, thereby rendering the input transistor P3 to be conductive. As a result, the output bit C being low will be passed to the node 40 (FIG. 4). At the time t4, the high level of the second clock phase signal PH2 will also cause the output bit C to be toggled to a high logic level at the same time t4a, as shown in FIG. 5(e). Thus, the output state of the counter stage 14-1 will be C=1 and the output complement signal OCMPL on the line 18-1 will be equal to the input complement signal ICMPL on the line 16 from the counter stage 12 since the transistor P1 (FIG. 4) will be turned off and the transmission gate TG will be closed. It should be noted that when the second clocked phase signal PH2 is high a complement PH1L (not shown) of the first clock phase signal will also be high. Hence, on every cycle of the complement PH1L of the first clock phase signal the charge/discharge node 38 will be discharged.

It should be apparent to those skilled in the art that a similar analysis can be made on the counter stages 12 and 14 in the counter circuit of FIG. 2 for each of the subsequent cycles of the clock phase signal PH1 in order to obtain the corresponding states of the output bits ABCD illustrated in FIGS. 5(c)-5(f), respectively. It should also be clear that the input complement signal ICMPL functions as a control signal to determine whether or not to complement or change (toggle) the current state of a particular output bit in the counter stages 14-1, 14-2 and 14-3. If ICMPL=Ø, then the particular bit will be allowed to toggle. If ICMPL=1, then this particular bit will be prohibited from changing its state and will remain in its present state. By using this approach, the number of circuit components that have been used for implementing each of the counter stages 14 have been reduced. In comparing FIG. 4 of the present counter cell 14 with the prior art counter cell 2 of FIG. 1, it can be seen that there is a saving of six transistors per cell.

From the foregoing detailed description, it can thus be seen that the present invention provides an improved counter cell which includes a latch circuit, a control circuit, and a pull-up circuit. Further, any number of such counter cells may be connected to form an N-bit counter circuit, the counter cells being constructed with a relatively small number of components so as to reduce the required amount of chip area.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A counter cell comprising:

a first clocked half-latch (32) formed of a first pass transistor (N2) and a pair of first and second inverters (INV2, INV3);

a second clocked half-latch (34) formed of a second pass transistor (N3) and a pair of third and fourth inverters (INV4, INV5);

a fifth inverter (INV1) having an input and an output for storing a bit signal at a first output terminal;

said first pass transistor (N2) having a source connected to the output of said fifth inverter (INV1) and a drain connected to an input of said first inverter (INV2), said first inverter (INV2) having an output connected to an input of said second inverter (INV3), said second inverter (INV3) having an ouput connected to the input of said first inverter (INV2);

said second pass transistor (N3) having a source connected to the output of said first inverter (INV2) and a drain connected to an input of said third inverter (INV4), said third inverter (INV4) having an output connected to an input of said fourth inverter (INV5) and to the input of said fifth inverter (INV1), said fourth inverter (INV5) having an output connected to the input of said third inverter (INV4);

an inhibit transistor (P3) having a source connected to a first input terminal for receiving a first clock phase signal and a drain connected to a gate of said first pass transistor (N2) at a charge/discharge node (38), a gate of said second pass transistor (N3) being connected to a second input terminal for receiving a second clock phase signal, a gate of said inhibit transistor (P3) being connected to a third input for receiving an input complement signal;

a discharge transistor (N1) having a drain connected to the charge/discharge node and a source connected to a ground potential, a gate of said discharge transistor (N1) being connected to a fourth input terminal for receiving the complement of said first clock phase signal;

a transmission gate (TG) formed of a P-channel transistor (P4) and an N-channel transistor (N4) having sources which are connected to the gate of said inhibit transistor (P3) and having drains which are connected to a second output terminal to provide an output complement signal, said P-channel transistor (P4) having a gate connected to the output of said third inverter (INV4) and said N-channel transistor (N4) having a gate connected to the first output terminal; and a pull-up transistor (P1) having a source connected to a supply potential and a drain connected to the second output terminal, a gate of said pull-up transistor (P1) being connected to the first output terminal.

2. A counter cell as claimed in claim 1, further comprising a reset transistor (P2) having a source connected to the supply potential, and a drain connected to the input of said first inverter (INV2), a gate of said reset transistor (P2) being connected to a fifth input terminal for receiving the complement of a reset signal.

3. A counter cell as claimed in claim 1, wherein said first and second pass transistors (N2, N3) and said discharge transistor (N1) are comprised of N-channel MOS transistors.

4. A counter cell as claimed in claim 1, wherein said pull-up, reset, and inhibit transistors (p1-P3) are comprised of P-channel MOS transistors.

5. A counter cell as claimed in claim 1, wherein a plurality of said counter cells are connected together to form an N-bit counter circuit.

6. A counter cell as claimed in claim 1, wherein a plurality of counter cells are connected together to form a 4-bit up-counter circuit.

7. A counter cell as claimed in claim 1, wherein said inverters (INV1-INV5) are comprised of CMOS inverters, each being formed of a P-channel transistor and an N-channel transistor.

8. A counter circuit formed of a plurality of counter stages, each counter stage except for a least significant bit stage comprising:

a first clocked half-latch (32) formed of a first pass transistor (N2) and a pair of first and second inverters (INV2, INV3);

a second clocked half-latch (34) formed of a second pass transistor (N3) and a pair of third and fourth inverters (INV4, INV5);

a fifth inverter (INV1) having an input and an output for storing a bit signal at a first output terminal;

said first pass transistor (N2) having a source connected to the output of said fifth inverter (INV1) and a drain connected to an input of said first inverter (INV2), said first inverter (INV2) having an output connected to an input of said second inverter (INV3), said second inverter (INV3) having an output connected to the input of said first inverter (INV2);

said second pass transistor (N3) having a source connected to the output of said first inverter (INV2) and a drain connected to an input of said third inverter (INV4), said third inverter (NV4) having an output connected to an input of said fourth inverter (INV5) and to the input of said fifth inverter (INV1), said fourth inverter (INV5) having an output connected to the input of said third inverter (INV4);

an inhibit transistor (P3) having a source connected to a first input terminal for receiving a first clock phase signal and a drain connected to a gate of said first pass transistor (N2) at a charge/discharge node (38), a gate of said second pass transistor (N3) being connected to a second input terminal for receiving a second clock phase signal, a gate of said inhibit transistor (P3) being connected to a third input for receiving an input complement signal;

a discharge transistor (N1) having a drain connected to the charge/discharge node and a source connected to a ground potential, a gate of said discharge transistor (N1) being connected to a fourth input terminal for receiving the complement of said first clock phase signal;

a transmission gate (TG) formed of a P-channel transistor (P4) and an N-channel transistor (N4) having sources which are connected to the gate of said inhibit transistor (p3) and having drains which are connected to a second output terminal to provide an output complement signal, said P-channel transistor (P4) having a gate connected to the output of said third inverter (INV4) and said N-channel transistor (N4) having a gate connected to the first output terminal; and a pull-up transistor (P1) having a source connected to a supply potential and a drain connected to the second output terminal, a gate of said pull-up transistor (P1) being connected to the first output terminal.

9. A counter circuit as claimed in claim 8, further comprising a reset transistor (P2) having a source connected to the supply potential, and a drain connected to the input of said first inverter (INV2), a gate of said reset transistor (P2) being connected to a fifth input terminal for receiving the complement of a reset signal.

10. A counter circuit as claimed in claim 8, wherein said first and second pass transistors (N2, N3 and said discharge transistor (N1) are comprised of N-channel MOS transistors.

11. A counter circuit as claimed in claim 8, wherein said pull-up, reset, and inhibit transistors (P1-P3) are comprised of P-channel MOS transistors.

12. A counter circuit as claimed in claim 8, wherein a plurality of said counter stages are connected together to form an N-bit counter circuit.

13. A counter circuit as claimed in claim 8, wherein a plurality of counter stages are connected together to form a 4- bit up-counter circuit.

14. A counter circuit as claimed in claim 8, wherein said inverters (INV1-INV5) are comprised of CMOS inverters, each being formed of a P-channel transistor and an N-channel transistor.

15. A counter cell comprising:

latch means for storing a binary output signal;

said latch means being formed of a first clocked half-latch (32) having an input and an output, a second clocked half-latch (34) having an input connected to the output of said first clocked half-latch and an output, and an inverter (INV1) having an input connected to the output of said second clocked half-latch and an output connected to the input of said first clocked half-latch;

said first clocked half-latch (32) being responsive to a first clock phase signal for transferring the binary output signal from its input to its output, said second clocked half-latch (34) being responsive to a second clock phase signal for transferring the binary output signal from its input to its output;

control circuit means responsive to an input complement signal for selectively passing the first clock phase signal to said first clocked half-latch so as to permit toggling the state of said binary output signal; and pull-up means responsive to said binary output signal and said input complement signal for generating an output complement signal, the logic value of said output complement signal being equal to the logic value of said input complement signal only when said binary output signal is at a high logic level whereby the logic value of said output complement signal is maintained at a high logic level when said binary output signal is at a low logic level.

16. A counter cell as claimed in claim 15, wherein said first clocked half-latch (32) is formed of a first pass transistor (N2) and a pair of first and second inverters (INV2, INV3).

17. A counter cell as claimed in claim 16, wherein said second clocked half-latch (34) is formed of a second pass transistor (N3) and a pair of third and fourth inverters (INV4, INV5).

18. A counter cell as claimed in claim 15, wherein said control circuit means comprises an inhibit transistor (P3).

19. A counter cell as claimed in claim 15, wherein said pull-up means comprises a transmission gate and a pull-up transistor (P1).

20. A counter cell as claimed in claim 15, wherein a plurality of said counter cells are connected together to form an N-bit counter circuit.

* * * * *

UNITED STATES PATENT AND TRADEMARK OFFICE
CERTIFICATE OF CORRECTION

PATENT NO. : 5,175,753
DATED : December 29, 1992
INVENTOR(S) : Pranay Gaglani

It is certified that error appears in the above-identified patent and that said Letters Patent is hereby corrected as shown below:

On the Title page, in the Abstract, line 6, "clockk", should be --clock--.

Column 1, line 34, "∅∅∅", should be --∅∅∅1--.

Column 9, line 21, "p1", should be --P1--.

Column 10, line 12, "p3", should be --P3--;
line 31, "N3", should be --N3)--.

Signed and Sealed this

Seventh Day of December, 1993

Attest:

BRUCE LEHMAN

*Attesting Officer*  *Commissioner of Patents and Trademarks*